United States Patent
Tolchinsky et al.

(12) 
(10) Patent No.: US 6,908,027 B2
(45) Date of Patent: Jun. 21, 2005

(54) COMPLETE DEVICE LAYER TRANSFER WITHOUT EDGE EXCLUSION VIA DIRECT WAFER BONDING AND CONSTRAINED BOND-STRENGTHENING PROCESS

(75) Inventors: Peter Tolchinsky, Beaverton, OR (US); Mohamad Shaheen, Portland, OR (US); Ryan Lei, Hillsboro, OR (US); Irwin Yablok, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 107 days.

(21) Appl. No.: 10/403,458

(22) Filed: Mar. 31, 2003

(65) Prior Publication Data

US 2004/0188501 A1 Sep. 30, 2004

(51) Int. Cl.⁷ ............................................... B23K 31/02
(52) U.S. Cl. ..................................... 228/234.1; 228/212
(58) Field of Search ............................ 228/234.1, 171, 228/205, 206, 207, 212; 156/60, 153, 281; 438/959, 964, 974, 906

(56) References Cited

U.S. PATENT DOCUMENTS

| | | | | |
|---|---|---|---|---|
| 4,939,101 A | * | 7/1990 | Black et al. ................. | 438/455 |
| 5,273,553 A | * | 12/1993 | Hoshi et al. ................ | 29/25.01 |
| 5,932,048 A | * | 8/1999 | Furukawa et al. ........... | 156/153 |
| 6,008,113 A | * | 12/1999 | Ismail et al. ................ | 438/615 |
| 6,423,613 B1 | | 7/2002 | Geusic ........................ | 438/455 |

FOREIGN PATENT DOCUMENTS

JP 11-067701 * 9/1999

OTHER PUBLICATIONS

Translation to JP 11–067701. Shuhei. Sep. 1999. 5 pages.*

* cited by examiner

*Primary Examiner*—Jonathan Johnson
(74) *Attorney, Agent, or Firm*—Trop, Pruner & Hu, P.C.

(57) ABSTRACT

More complete bonding of wafers may be achieved out to the edge regions of the wafer by constrained bond strengthening of the wafers in a pressure bonding apparatus after direct wafer bonding. The pressure bonding process may be accompanied by the application of not above room temperature.

8 Claims, 1 Drawing Sheet

COMPLETE DEVICE LAYER TRANSFER WITHOUT EDGE EXCLUSION VIA DIRECT WAFER BONDING AND CONSTRAINED BOND-STRENGTHENING PROCESS

BACKGROUND

This invention relates generally to wafer bonding.

In wafer bonding, two semiconductor wafers may be placed in a face-to-face configuration. A layer on one semiconductor wafer may be transferred to the other semiconductor wafer in a process called wafer bonding. A wide variety of layers may be transferred between semiconductor wafers. One application for wafer bonding is in connection with forming silicon on insulator (SOI) devices.

Generally, a pair of opposed flat silicon wafers are contacted to one another so that they physically and chemically bond. A layer is transferred from a donor wafer to a handle wafer.

One problem with existing wafer bonding processes is that a peripheral region of the handle wafer, generally about 3 to 5 millimeters, may remain unbonded. This unbonded peripheral region is a region on the outer periphery of the wafer extending radially inwardly from the edge of the wafer to a distance of about 3 to 5 millimeters.

As a result of this unbonded region, islands of material, debris, particles, and flakes may collect in the unbonded region created by the resulting edge. These particles may ultimately release, resulting in problematic defects. In addition, the wafers may only have a useable surface area up to 3 to 5 millimeters inwardly of the outermost edge. The unbonded area may result in some loss of useable wafer area.

Thus, there is a need for better ways to wafer bond wafers.

DETAILED DESCRIPTION

Figure 1:
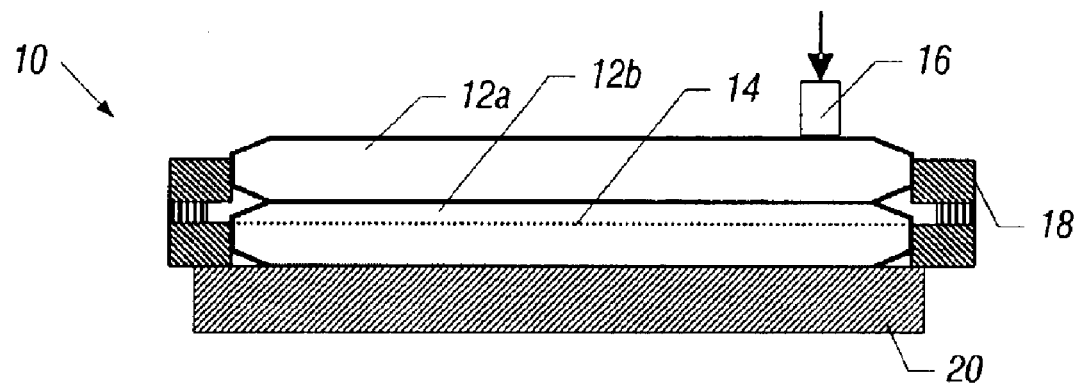
FIG. 1 is a cross-sectional view of one embodiment of the present invention.

Referring to FIG. 1, a pair of wafers 12a and 12b may be located in a free state condition on a bonding plate 20. Bonding may be initiated at the edge or center of the wafers 12.

During bonding, elastic deformation of donor wafer 12b and handle wafer 12a may occur microscopically, compensating for surface roughness, topography, flatness, and profile in the center and edge regions of the wafers. The strength of the surface Van der Waals forces may not be sufficient to elastically deform the areas at the edges of the wafers 12.

Even where bonding occurs at the edges of the wafers 12, the bonding forces may not be strong enough to overcome the natural tendency for the wafers to pull apart due to the surface characteristics. This leads to non-layer transfer areas resulting in loss of transferred device film of up to 5 millimeters unbonded inboard of the circular area at the handle wafer edge.

Thus, as shown in FIG. 1, the wafers 12 may be pressed together to direct bond and transfer the film 14 from the donor wafer 12b to the handle wafer 12a. The donor wafer 12b may be mounted on a mounting plate 20. The wafers 12a and 12b may be pressed together centrally or peripherally as indicated by the pressure element 16 and the associated arrow. At such time, the wafers 12 may be held in alignment by the jig 18.

Figure 2:
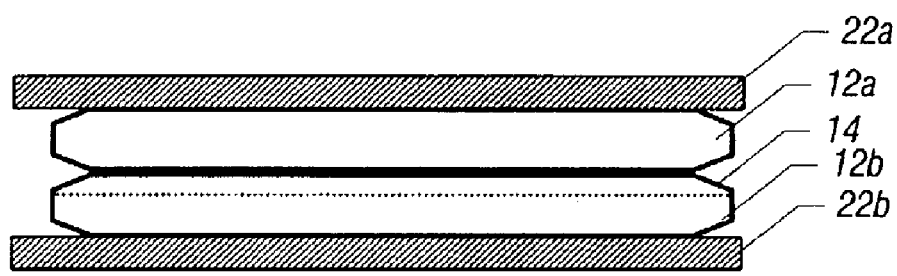
FIG. 2 is a cross-sectional view of wafers in accordance with one embodiment of the present invention.

After direct bonding, the bonded pair may be put into a pressure bonding apparatus, shown in FIG. 2, to flatten and bring into contact unbonded areas that split from the initial bonding of the handle and donor wafers 12. In this case, a pair of rigid, flat, parallel plates 22a and 22b may be positioned on either opposed surface of the bonded wafers 12 and pressure may be applied substantially uniformly across at least one plate 22 while the other plate 12 is supported. In one embodiment, the applied pressure may be from 0.01 pounds per square inch to 0.35 pounds per square inch. The pressure may be applied for 10 to 30 minutes in some embodiments.

Bond strengthening may be achieved by heat treatment of the bonded pair in the pressure bonding apparatus shown in FIG. 2. The heat treatment may convert Van der Waals surface interactions into stronger covalent bonds between donor and handle wafers 12 over the entire wafer contact area.

Figure 3:
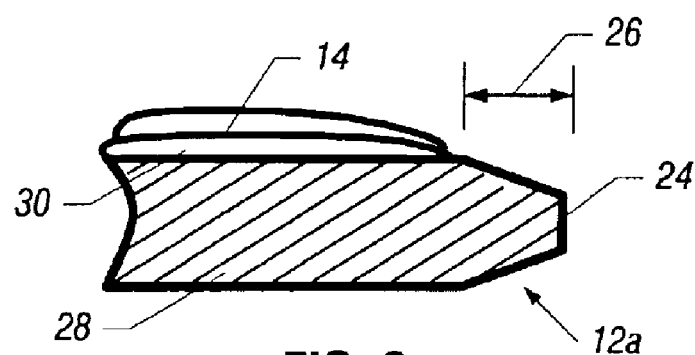
FIG. 3 is a partial cross-sectional view of the results of wafer bonding in accordance with one embodiment of the present invention.

Then subsequent layer exfoliation results in more complete device layer transfer as shown in FIG. 3. As indicated in FIG. 3, the film 14 from the donor wafer 12b may be transferred close to the peripheral edge 24 of the wafer 12a. In one embodiment, the wafer 12a may be a silicon on insulator wafer having bulk silicon 28 covered by an insulator 30 over which is bonded the film 14.

The heat processing may involve temperatures of 100 to 600° C. for times from 1 to 30 minutes in some embodiments of the present invention.

As a result, in some embodiments, even where-wafer non-uniformities occur, direct wafer bonding of donor and handle wafers accompanied by constrained annealing of the bonded pair facilitate complete wafer bonding. As a result, the 3 to 5 millimeter region of non-bonding with conventional processes may be reduced, facilitating complete wafer surface bonding. In some embodiments, less than 3 millimeters of edge exclusion 26 may occur with complete surface area contact and film 14 bonding across the wafer 12a.

This more complete bonding may reduce the edge region that tends to collect particles and flakes. This may reduce the ensuing defects caused by such particles in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

positioning a pair of wafers in face-to-face contact;

applying pressure to said wafers to initiate wafer bonding;

after applying pressure, positioning the wafers between a pair of parallel rigid plates;

pressing said wafers together between said plates; and heating said wafers while said wafers are between said pair of parallel plates.

2. The method of claim 1 including applying heat while said wafers are between said plates of approximately 100 to 600° C.

3. The method of claim 2 including applying heat for at least one minute.

4. The method of claim 3 including creating an unbonded surface area of less than 5 millimeters from the peripheral edge of a wafer.

5. The method of claim 1 including pressing by applying substantially uniform pressure across the entire surface of a wafer through said parallel plates.

6. The method of claim 5 including applying pressure to said wafers of at least 0.01 pounds per square inch.

7. The method of claim 6 including applying pressure less than about 0.35 pounds per square inch.

8. The method of claim 1 including converting Van der Waal surface interactions into stronger covalent bonds between the wafers by the application of heat.

* * * * *